United States Patent
Chen

(10) Patent No.: US 11,158,251 B1
(45) Date of Patent: Oct. 26, 2021

(54) OLED PIXEL DRIVING CIRCUIT AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Caiqin Chen, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 447 days.

(21) Appl. No.: 16/342,548

(22) PCT Filed: Jan. 3, 2019

(86) PCT No.: PCT/CN2019/070241
§ 371 (c)(1),
(2) Date: Apr. 17, 2019

(87) PCT Pub. No.: WO2020/113753
PCT Pub. Date: Jun. 11, 2020

(30) Foreign Application Priority Data

Dec. 5, 2018 (CN) .......................... 201811477478.8

(51) Int. Cl.
*G09G 3/3233* (2016.01)
*H01L 27/32* (2006.01)
(Continued)

(52) U.S. Cl.
CPC ....... *G09G 3/3233* (2013.01); *H01L 27/3262* (2013.01); *G09G 2300/0809* (2013.01);
(Continued)

(58) Field of Classification Search
CPC ......... G09G 3/3233; G09G 2300/0809; G09G 2320/0252; H01L 27/3262;
(Continued)

(56) References Cited

U.S. PATENT DOCUMENTS 9,330,601 B2 * 5/2016 Lee ...................... G09G 3/3233
9,812,082 B2 * 11/2017 Chen .................... G09G 3/3659
(Continued)

FOREIGN PATENT DOCUMENTS

CN 104464635 A 3/2015
CN 106531077 A 3/2017
(Continued)

*Primary Examiner* — Vinh T Lam
(74) *Attorney, Agent, or Firm* — Soroker Agmon Nordman

(57) ABSTRACT

An organic light emitting diode (OLED) pixel driving circuit and a display panel are disclosed. The OLED pixel driving circuit is a 7T1C type pixel driving circuit consisting of a first transistor, a second transistor, a third transistor, a fourth transistor, a fifth transistor, a sixth transistor, a seventh transistor, a capacitor, and an organic light emitting diode. Each of the first, second, third, fourth, fifth, sixth, and seventh transistors has a control end, a first end, and a second end, wherein the control end and the second end of the seventh transistor are coupled, the control end and the second end of the fourth transistor are coupled, and the second end of the fourth transistor and the second end of the seventh transistor are not connected to each other.

10 Claims, 3 Drawing Sheets

(51) Int. Cl.
*H01L 29/786* (2006.01)
*H01L 27/12* (2006.01)

(52) U.S. Cl.
CPC .. *G09G 2320/0252* (2013.01); *H01L 27/1225* (2013.01); *H01L 27/1251* (2013.01); *H01L 29/7869* (2013.01); *H01L 29/78672* (2013.01)

(58) Field of Classification Search
CPC .......... H01L 29/78672; H01L 27/1251; H01L 29/7869; H01L 27/1225
See application file for complete search history.

(56) References Cited

U.S. PATENT DOCUMENTS

| | | | | |
|---|---|---|---|---|
| 9,818,343 | B2 * | 11/2017 | Kim | G09G 3/3233 |
| 10,032,413 | B2 * | 7/2018 | Kim | G09G 3/3233 |
| 10,510,277 | B2 * | 12/2019 | Wang | G09G 3/3233 |
| 10,510,298 | B2 * | 12/2019 | Zhang | G09G 3/3233 |
| 10,586,496 | B2 * | 3/2020 | Kim | G09G 3/3275 |
| 10,672,340 | B2 * | 6/2020 | Li | G09G 3/3266 |
| 2016/0104421 | A1 * | 4/2016 | Park | G09G 3/3233 345/212 |
| 2016/0117983 | A1 * | 4/2016 | Li | G09G 3/3233 345/76 |
| 2016/0125808 | A1 | 5/2016 | Hsu et al. | |
| 2016/0148985 | A1 * | 5/2016 | Park | H01L 27/3262 257/40 |
| 2016/0204182 | A1 * | 7/2016 | Son | H01L 27/3276 257/40 |
| 2016/0217733 | A1 * | 7/2016 | Kim | G09G 3/3225 |
| 2016/0233288 | A1 * | 8/2016 | Lee | H01L 27/3262 |
| 2016/0307981 | A1 * | 10/2016 | Jung | H01L 27/3262 |
| 2016/0351122 | A1 * | 12/2016 | Jung | G09G 3/2085 |
| 2016/0351150 | A1 * | 12/2016 | Ma | G09G 3/3677 |
| 2017/0092200 | A1 * | 3/2017 | Park | G09G 3/3266 |
| 2017/0103701 | A1 * | 4/2017 | Zhu | G09G 3/3233 |
| 2017/0110054 | A1 * | 4/2017 | Sun | G09G 3/3291 |
| 2017/0117343 | A1 * | 4/2017 | Oh | H01L 27/3262 |
| 2017/0193910 | A1 * | 7/2017 | Chen | G09G 3/325 |
| 2017/0270859 | A1 * | 9/2017 | Li | G09G 3/3258 |
| 2018/0047335 | A1 * | 2/2018 | Hwang | G09G 3/3275 |
| 2018/0061915 | A1 * | 3/2018 | Yu | H01L 27/3262 |
| 2018/0102400 | A1 * | 4/2018 | Choi | H01L 27/3276 |
| 2018/0102498 | A1 * | 4/2018 | Shin | H01L 51/5218 |
| 2018/0114823 | A1 * | 4/2018 | Lee | H01L 27/3248 |
| 2018/0130424 | A1 * | 5/2018 | Gao | H01L 27/1251 |
| 2018/0151115 | A1 * | 5/2018 | Tseng | G09G 3/3266 |
| 2018/0151663 | A1 * | 5/2018 | Kim | H01L 27/124 |
| 2018/0166025 | A1 * | 6/2018 | Zhou | G09G 3/3233 |
| 2018/0211592 | A1 * | 7/2018 | Li | G09G 3/3233 |
| 2019/0057648 | A1 * | 2/2019 | Xu | G09G 3/3233 |
| 2019/0066580 | A1 * | 2/2019 | Xu | G09G 3/3233 |
| 2019/0096330 | A1 * | 3/2019 | Kim | G09G 3/3266 |
| 2019/0130846 | A1 * | 5/2019 | Chung | G09G 3/3266 |
| 2019/0188444 | A1 * | 6/2019 | Yang | G06K 9/00013 |
| 2019/0197949 | A1 * | 6/2019 | Kim | G09G 3/3266 |
| 2019/0304364 | A1 * | 10/2019 | Xiao | G09G 3/3233 |
| 2019/0304371 | A1 | 10/2019 | Li | |

FOREIGN PATENT DOCUMENTS

| | | |
|---|---|---|
| CN | 207217082 U | 4/2018 |
| CN | 108182897 A | 6/2018 |
| CN | 108492782 A | 9/2018 |
| CN | 108807715 A | 11/2018 |

* cited by examiner

OLED PIXEL DRIVING CIRCUIT AND DISPLAY PANEL

FIELD OF INVENTION

The present disclosure relates to the technical field of displays, and specifically to an organic light emitting diode (OLED) pixel driving circuit and a display panel.

BACKGROUND OF INVENTION

Organic light emitting diode (OLED) display panels have advantages such as self-illumination, low driving voltage, high luminous efficiency, short response times, and flexible display, and have become the most promising display panels.

According to driving types, the OLED display panels can be divided into two types: a passive matrix OLED (PMOLED) and an active matrix OLED (AMOLED). Power consumption of AMOLED display panels are significantly smaller than that of PMOLED display panels. In a pixel array of the AMOLED display panel, each pixel has a capacitor for storing data, such that each pixel can be maintained in a light-emitting state. A pixel driving circuit of conventional AMOLED display panels usually drives an organic light emitting diode with a plurality of transistors and a capacitor.

As shown in FIG. 1 and FIG. 2, the conventional 7T1C pixel driving circuit includes transistors T1 to T7, a capacitor C1, and an organic light emitting diode D. The conventional 7T1C pixel driving circuit is operated by using six control signals, such as Scan[n−1], Scan[n], XScan[n], EM, Vi, and Vdd, which are shown in FIG. 2. Working phases of the conventional 7T1C pixel driving circuit can be generally divided into a preparation phase (t1), a compensation phase (t2), and a display phase (t3). Taking the panel with WQHD resolution (i.e., 1440*2960; 18.5:9) as an example, a gate scanning frequency is 60 Hz, that is, gate driven time in the phases of t1 or t2 is $1/60/(1440\ T_{blank})$, that is, about 6 microsecond (μs), while $t3=1/60-t1-t2$, that is, gate driven time of the t3 phase is about 16.7 milliseconds (ms). However, this time is very long for the transistors, such as T1, T5, and T6, that are turned on in the t3 phase. It will affect display effects of the OLED display panel.

Therefore, the prior art has drawbacks and is required to be improved urgently.

SUMMARY OF INVENTION

The present disclosure provides an organic light emitting diode (OLED) pixel driving circuit to solve the problem that the display effect of the prior art is affected by the gate driving time in the display phase.

An aspect of the present disclosure provides an organic light emitting diode (OLED) pixel driving circuit, which includes a first transistor, a second transistor, a third transistor, a fourth transistor, a fifth transistor, a sixth transistor, a seventh transistor, a capacitor, and an OLED, wherein each of the first transistor, the second transistor, the third transistor, the fourth transistor, the fifth transistor, the sixth transistor, and the seventh transistor has a control end, a first end, and a second end; wherein the control end of the first transistor is coupled to one end of the capacitor, the first end of the third transistor, and the first end of the fourth transistor; the first end of the first transistor is coupled to the second end of the second transistor and the first end of the fifth transistor; the second end of the first transistor is coupled to the second end of the third transistor and the first end of the sixth transistor; the control end of the second transistor is coupled to the control end of the third transistor and a current-stage scan terminal, the first end of the second transistor is coupled to a data terminal; the control end of the fourth transistor is coupled to the second end of the fourth transistor and a previous scan terminal; the control end of the fifth transistor is coupled to the control end of the sixth transistor and a light emitting pulse terminal; the second end of the fifth transistor is coupled to the other end of the capacitor and a positive power terminal; the second end of the sixth transistor is coupled to the first end of the seventh transistor and an anode of the OLED; the control end of seventh transistor is coupled to the second end of the seventh transistor and the current-stage scan terminal; and a cathode of the OLED is grounded; wherein the second end of the fourth transistor and the second end of the seventh transistor are not connected to each other; and wherein the first transistor, the second transistor, the third transistor, the fourth transistor, the fifth transistor, the sixth transistor, and the seventh transistor are P-type thin field transistors.

In some embodiments, each of the first transistor, the second transistor, the third transistor, the fourth transistor, the fifth transistor, the sixth transistor, and the seventh transistor is one of a low temperature poly-silicon thin film transistor, an oxide semiconductor thin film transistor, or an amorphous silicon thin film transistor.

Another aspect of the present disclosure provides an organic light emitting diode (OLED) pixel driving circuit, which includes a first transistor, a second transistor, a third transistor, a fourth transistor, a fifth transistor, a sixth transistor, a seventh transistor, a capacitor, and an OLED, wherein each of the first transistor, the second transistor, the third transistor, the fourth transistor, the fifth transistor, the sixth transistor, and the seventh transistor has a control end, a first end, and a second end; and wherein the control end of the first transistor is coupled to one end of the capacitor, the first end of the third transistor, and the first end of the fourth transistor; the first end of the first transistor is coupled to the second end of the second transistor and the first end of the fifth transistor; the second end of the first transistor is coupled to the second end of the third transistor and the first end of the sixth transistor; the control end of the second transistor is coupled to the control end of the third transistor and a current-stage scan terminal; the first end of the second transistor is coupled to a data terminal; the control end of the fourth transistor is coupled to the second end of the fourth transistor and a previous-stage scan terminal; the control end of the fifth transistor is coupled to the control end of the sixth transistor and a light emitting pulse terminal; the second end of the fifth transistor is coupled to the other end of the capacitor and a positive power terminal; the second end of the sixth transistor is coupled to the first end of the seventh transistor and an anode of the OLED; the control end of seventh transistor is coupled to the second end of the seventh transistor and the current-stage scan terminal; and a cathode of the OLED is grounded.

In some embodiments, the second end of the fourth transistor and the second end of the seventh transistor are not connected to each other.

In some embodiments, the first transistor, the second transistor, the third transistor, the fourth transistor, the fifth transistor, the sixth transistor, and the seventh transistor are P-type thin field transistors.

In some embodiments, each of the first transistor, the second transistor, the third transistor, the fourth transistor, the fifth transistor, the sixth transistor, and the seventh transistor is one of a low temperature poly-silicon thin film transistor, an oxide semiconductor thin film transistor, or an amorphous silicon thin film transistor.

Still another aspect of the present disclosure provides a display panel, which includes a plurality of organic light emitting diode (OLED) pixel driving circuits, wherein each of the OLED pixel driving circuits includes a first transistor, a second transistor, a third transistor, a fourth transistor, a fifth transistor, a sixth transistor, a seventh transistor, a capacitor, and an OLED, wherein each of the first transistor, the second transistor, the third transistor, the fourth transistor, the fifth transistor, the sixth transistor, and the seventh transistor has a control end, a first end, and a second end; and wherein the control end of the first transistor is coupled to one end of the capacitor, the first end of the third transistor, and the first end of the fourth transistor; the first end of the first transistor is coupled to the second end of the second transistor and the first end of the fifth transistor; the second end of the first transistor is coupled to the second end of the third transistor and the first end of the sixth transistor; the control end of the second transistor is coupled to the control end of the third transistor and a current-stage scan terminal; the first end of the second transistor is coupled to a data terminal; the control end of the fourth transistor is coupled to the second end of the fourth transistor and a previous-stage scan terminal; the control end of the fifth transistor is coupled to the control end of the sixth transistor and a light emitting pulse terminal; the second end of the fifth transistor is coupled to the other end of the capacitor and a positive power terminal; the second end of the sixth transistor is coupled to the first end of the seventh transistor and an anode of the OLED; the control end of seventh transistor is coupled to the second end of the seventh transistor and the current-stage scan terminal; and a cathode of the OLED is grounded.

In some embodiments, the second end of the fourth transistor and the second end of the seventh transistor are not connected to each other.

In some embodiments, the first transistor, the second transistor, the third transistor, the fourth transistor, the fifth transistor, the sixth transistor, and the seventh transistor are P-type thin field transistors.

In some embodiments, each of the first transistor, the second transistor, the third transistor, the fourth transistor, the fifth transistor, the sixth transistor, and the seventh transistor is one of a low temperature poly-silicon thin film transistor, an oxide semiconductor thin film transistor, or an amorphous silicon thin film transistor.

Compared with the prior art, the OLED pixel driving circuit and the display panel of the present disclosure are implemented by the control end and the second end of the fourth transistor are short-circuited, the control end and the second end of the seventh transistor are short-circuited, and the second end of the fourth transistor and the second end of the seventh transistor are not connected to each other. Thus, charging time of the capacitor can be greatly shortened, and a gate driving ability of the first transistor is stronger.

DETAILED DESCRIPTION OF PREFERRED EMBODIMENTS

The following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, lateral, vertical, longitudinal, axial, radial, uppermost or lowermost, etc., which only refer to the direction of drawings. Therefore, the directional terms used as above are for the purpose of illustration and understanding of the present disclosure, and are not intended to limit the present disclosure.

Figure 3:
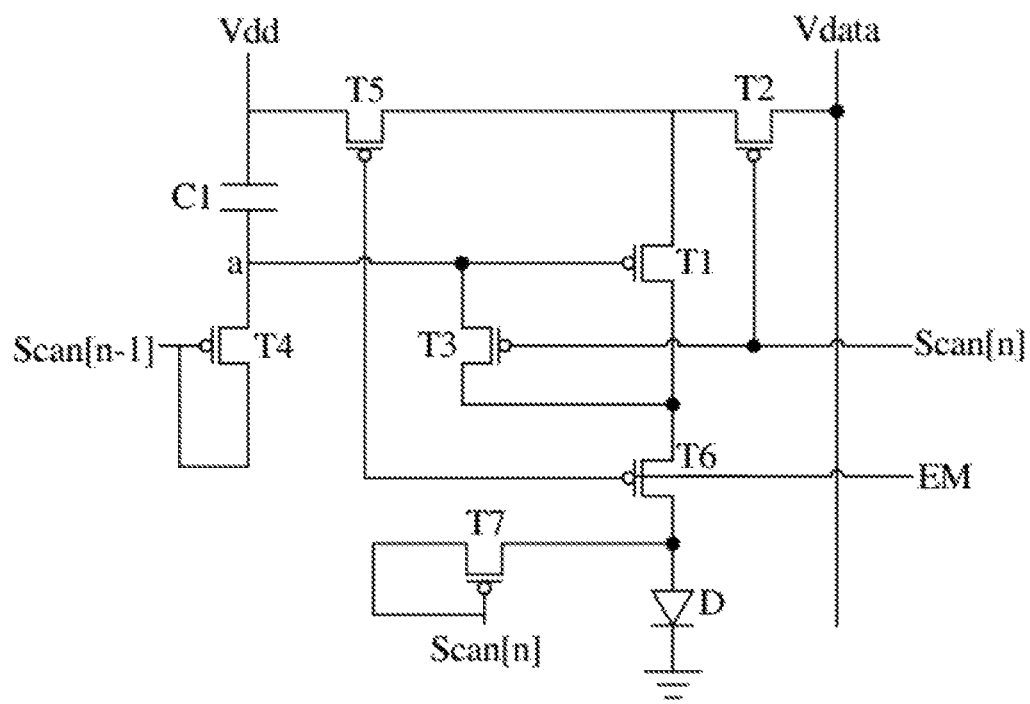
FIG. 3 is a schematic diagram of an organic light emitting diode (OLED) pixel driving circuit according to an embodiment of the present disclosure.

As shown in FIG. 3, an organic light emitting diode (OLED) pixel driving circuit according to an embodiment of the present disclosure can be used for an active matrix organic light emitting diode (AMOLED) pixel driving configuration. The OLED pixel driving circuit includes: a first transistor T1, a second transistor T2, a third transistor T3, a fourth transistor T4, a fifth transistor T5, a sixth transistor T6, a seventh transistor T7, a capacitor C1, and an organic light emitting diode D, each of the first transistor T1, the second transistor T2, the third transistor T3, the fourth transistor T4, the fifth transistor T5, the sixth transistor T6, and the seventh transistor T7 has a control end, a first end, and a second end. For example, the control end may be a gate of a thin film transistor, and one of the first end and the second end may be one of a source or a drain of the thin film transistor.

A control end of the first transistor T1 is coupled to one end of the capacitor C1, a first end of the third transistor T3, and a first end of the fourth transistor T4. A first end of the first transistor T1 is coupled to a second end of the second transistor T2 and a first end of the fifth transistor T5. A second end of the first transistor T1 is coupled to a second end of the third transistor T3 and a first end of the sixth transistor T6. A control end of the second transistor T2 is coupled to a control end of the third transistor T3 and a current-stage (i.e., n-th stage) scan terminal, for example, n may be a positive integer and is used to represent one of multiple cascaded signals, wherein the current-stage (i.e., n-th stage) scan terminal is configured to input a Scan[n] signal. A first end of the second transistor T2 is coupled to a data terminal, which is configured to input a Vdata signal. A control end of the fourth transistor T4 is coupled to a second end of the fourth transistor T4 and a previous-stage (i.e., (n−1)th stage) scan terminal. A control end of the fifth transistor T5 is coupled to a control end of the sixth transistor T6 and a light emitting pulse terminal, which is configured to input an EM signal. A second end of the fifth transistor T5 is coupled to the other end of the capacitor C1 and a positive power terminal, which is configured to input a Vdd signal. A second end of the sixth transistor T6 is coupled to a first end of the seventh transistor T7 and an anode of the OLED D. A control end of seventh transistor T7 is coupled to a second end of the seventh transistor T7 and the n-th stage scan terminal. A cathode of the OLED D is grounded. Specifically, the second end of the fourth transistor T4 and the second end of the seventh transistor T7 are not connected to each other.

It can be understood that, the organic light emitting diode D can be configured to emit red light, green light, and blue light according to actual requirements. The Scan[n−1] signal and the Scan[n] signal are scan signals from the (n−1)th stage and the n-th stage of a gate driver on array (GOA) circuit; the EM signal is a light emitting pulse signal for controlling light emitting of the organic light emitting diode D. The Vdd signal is a constant current constant voltage positive electric signal, which can be used as an operating power of the OLED pixel driving circuit, in which, characteristics are understood by those skilled in the art and will not be described again.

In some embodiments, each of the first transistor T1, the second transistor T2, the third transistor T3, the fourth transistor T4, the fifth transistor T5, the sixth transistor T6, and the seventh transistor T7 is a P-type thin film transistor, such as one of a low temperature poly-silicon thin film transistor, an oxide semiconductor thin film transistor, or an amorphous silicon thin film transistor, but that is not limited as described here.

Figure 1:
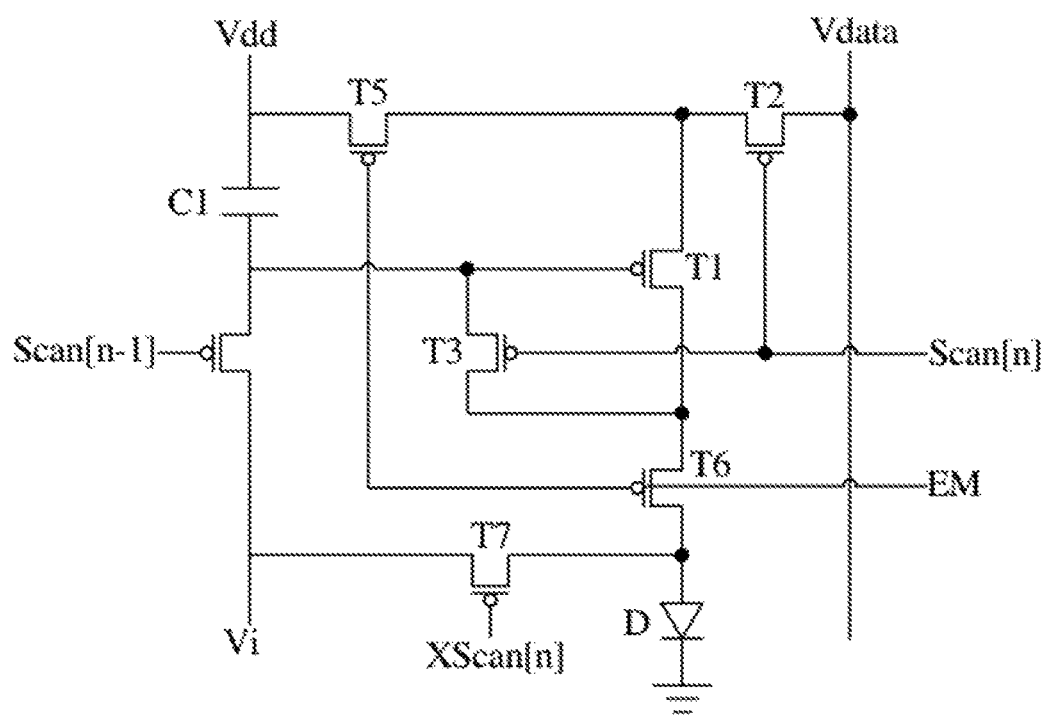
FIG. 1 is a schematic diagram of a conventional 7T1C pixel driving circuit.
Figure 2:
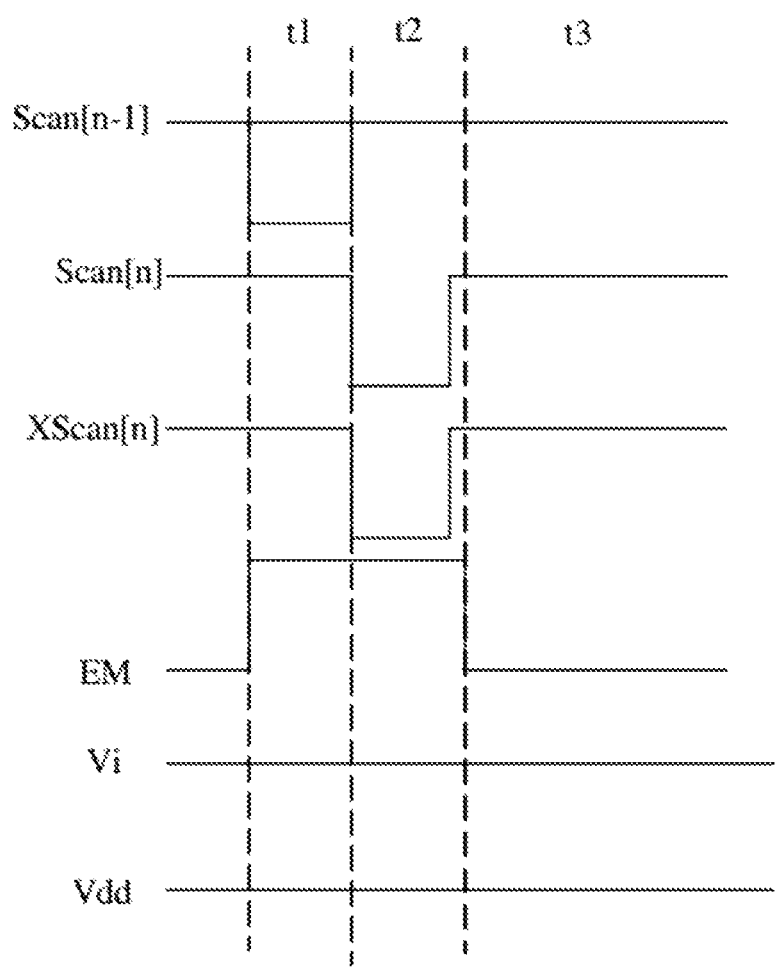
FIG. 2 is a timing diagram of control signals of the circuit in FIG. 1.

Please refer to FIG. 3 again, the OLED pixel driving circuit of the present disclosure belongs to a novel 7T1C pixel driving circuit. Compared with the conventional 7T1C pixel driving circuit, the conventional 7T1C pixel driving circuit requires six signals, such as Scan[n−1], Scan[n], XScan[n], EM, Vi, and Vdd, as shown in FIG. 2, but the OLED pixel driving circuit of the present disclosure only needs four signals, such as Scan[n−1], Scan[n], EM, and Vdd to be operated in a preparation phase (t1), a compensation phase (t2), and a display phase (t3) without the XScan[n] and Vi signals, which are required in the prior art (as shown in FIG. 2). An example of operation modes of the OLED pixel driving circuit of the present disclosure is taken as follows.

For example, as shown in FIG. 3, in the t1 phase, the Scan[n−1] signal is low potential, the fourth transistor T4 is turned on, the potential at a point a is turned to low, and the capacitor C1 is charged.

In the t2 phase, the Scan[n] signal is low potential, the transistors T2, T3, and T7 are turned on, and a gate and a drain of the transistor T1 are short-circuited. When the potential at the point a is |Va|>|Vth|, the transistor T1 is operated as a diode, that is, the transistor T1 is turned on until the potential at the point a is equal to (Vdata−|Vth|) to make that the transistor T1 is turned off, in addition, the transistor T7 is turned on, and the organic light emitting diode D is reset.

In the t3 phase, the EM signal is low, the fifth transistor T5 and the sixth transistor T6 are turned on, and voltage Vgs of the first transistor T1 is equal to Vdd−(Vdata−|Vth|). Meanwhile, current flows through the first transistor T1 is represented to $Ids=(½)·K·[(Vdd−(Vdata−|Vth|)−|Vth|]^2=(½)·K·(Vdd−Vdata)^2$, $K=Cox·μ·W/L$. The current flows through the organic light emitting diode D to make that the organic light emitting diode D emits light, such as red light, blue light, or green light. Specifically, low potential of the Scan[n] signal from the GOA circuit is approximately −9 volts (V).

Another aspect of the present disclosure may also include a display panel, which may include a plurality of OLED pixel drive circuits as described above.

Compared with the prior art, the OLED pixel driving circuit and the display panel of the present disclosure are implemented by the control end (such as the gate of the thin field transistor) and the second end (such as the source of the thin field transistor) of the fourth transistor T4 are short-circuited, the control end (such as the gate of the thin field transistor) and the second end (such as the source of the thin field transistor) of the seventh transistor T7 are short-circuited, and the second end of the fourth transistor T4 and the second end of the seventh transistor T7 are not connected to each other. Thus, charging time of the capacitor C1 can be greatly shortened, and a gate driving ability of the first transistor T1 is stronger.

The present disclosure has been described by the above related embodiments, but the above embodiments are merely examples for implementing the present disclosure. It must be noted that the disclosed embodiments do not limit the scope of the disclosure. On the contrary, it includes that modifications and equalization settings within the spirit and scope of the claims are within the scope of the present disclosure.

What is claimed is:

1. An organic light emitting diode (OLED) pixel driving circuit, comprising:
 a first transistor, a second transistor, a third transistor, a fourth transistor, a fifth transistor, a sixth transistor, a seventh transistor, a capacitor, and an OLED, wherein the first transistor, the second transistor, each of the third transistor, the fourth transistor, the fifth transistor, the sixth transistor, and the seventh transistor has a control end, a first end, and a second end;
 wherein the control end of the first transistor is coupled to one end of the capacitor, the first end of the third transistor, and the first end of the fourth transistor; the first end of the first transistor is coupled to the second end of the second transistor and the first end of the fifth transistor, the second end of the first transistor is coupled to the second end of the third transistor and the first end of the sixth transistor, the control end of the second transistor is coupled to the control end of the third transistor and a current-stage scan terminal; the first end of the second transistor is coupled to a data terminal, the control end of the fourth transistor is coupled to the second end of the fourth transistor and a previous scan terminal; the control end of the fifth transistor is coupled to the control end of the sixth transistor and a light emitting pulse terminal; the second end of the fifth transistor is coupled to the other end of the capacitor and a positive power terminal; the second end of the sixth transistor is coupled to the first end of the seventh transistor and an anode of the OLED; the control end of seventh transistor is coupled to the second end of the seventh transistor and the current-stage scan terminal; and a cathode of the OLED is grounded;
 wherein the second end of the fourth transistor and the second end of the seventh transistor are not connected to each other, and
 wherein the first transistor, the second transistor, the third transistor, the fourth transistor, the fifth transistor, the sixth transistor, and the seventh transistor are P-type thin field transistors.

2. The OLED pixel driving circuit as claimed in claim 1, wherein each of the first transistor, the second transistor, the third transistor, the fourth transistor, the fifth transistor, the sixth transistor, and the seventh transistor is one of a low temperature poly-silicon thin film transistor, an oxide semiconductor thin film transistor, or an amorphous silicon thin film transistor.

3. An organic light emitting diode (OLED) pixel driving circuit, comprising:
 a first transistor, a second transistor, a third transistor, a fourth transistor, a fifth transistor, a sixth transistor, a seventh transistor, a capacitor, and an OLED, wherein each of the first transistor, the second transistor, the third transistor, the fourth transistor, the fifth transistor, the sixth transistor, and the seventh transistor has a control end, a first end, and a second end; and wherein the control end of the first transistor is coupled to one end of the capacitor, the first end of the third transistor, and the first end of the fourth transistor; the first end of the first transistor is coupled to the second end of the second transistor and the first end of the fifth transistor; the second end of the first transistor is coupled to the second end of the third transistor and the first end of the sixth transistor, the control end of the second transistor is coupled to the control end of the third transistor and a current-stage scan terminal; the first end of the second transistor is coupled to a data terminal; the control end of the fourth transistor is coupled to the second end of the fourth transistor and a previous-stage scan terminal; the control end of the fifth transistor is coupled to the control end of the sixth transistor and a light emitting pulse terminal; the second end of the fifth transistor is coupled to the other end of the capacitor and a positive power terminal; the second end of the sixth transistor is coupled to the first end of the seventh transistor and an anode of the OLED; the control end of seventh transistor is coupled to the second end of the seventh transistor and the current-stage scan terminal; and a cathode of the OLED is grounded.

4. The OLED pixel driving circuit as claimed in claim 3, wherein the second end of the fourth transistor and the second end of the seventh transistor are not connected to each other.

5. The OLED pixel driving circuit as claimed in claim 3, wherein the first transistor, the second transistor, the third transistor, the fourth transistor, the fifth transistor, the sixth transistor, and the seventh transistor are P-type thin field transistors.

6. The OLED pixel driving circuit as claimed in claim 5, wherein each of the first transistor, the second transistor, the third transistor, the fourth transistor, the fifth transistor, the sixth transistor, and the seventh transistor is one of a low temperature poly-silicon thin film transistor, an oxide semiconductor thin film transistor, or an amorphous silicon thin film transistor.

7. A display panel, comprising a plurality of organic light emitting diode (OLED) pixel driving circuits, wherein each of the OLED pixel driving circuits comprises:

a first transistor, a second transistor, a third transistor, a fourth transistor, a fifth transistor, a sixth transistor, a seventh transistor, a capacitor, and an OLED, wherein each of the first transistor, the second transistor, the third transistor, the fourth transistor, the fifth transistor, the sixth transistor, and the seventh transistor has a control end, a first end, and a second end; and wherein the control end of the first transistor is coupled to one end of the capacitor, the first end of the third transistor, and the first end of the fourth transistor, the first end of the first transistor is coupled to the second end of the second transistor and the first end of the fifth transistor; the second end of the first transistor is coupled to the second end of the third transistor and the first end of the sixth transistor, the control end of the second transistor is coupled to the control end of the third transistor and a current-stage scan terminal; the first end of the second transistor is coupled to a data terminal; the control end of the fourth transistor is coupled to the second end of the fourth transistor and a previous-stage scan terminal; the control end of the fifth transistor is coupled to the control end of the sixth transistor and a light emitting pulse terminal; the second end of the fifth transistor is coupled to the other end of the capacitor and a positive power terminal; the second end of the sixth transistor is coupled to the first end of the seventh transistor and an anode of the OLED; the control end of seventh transistor is coupled to the second end of the seventh transistor and the current-stage scan terminal; and a cathode of the OLED is grounded.

8. The display panel as claimed in claim 7, wherein the second end of the fourth transistor and the second end of the seventh transistor are not connected to each other.

9. The display panel as claimed in claim 7, wherein the first transistor, the second transistor, the third transistor, the fourth transistor, the fifth transistor, the sixth transistor, and the seventh transistor are P-type thin field transistors.

10. The display panel as claimed in claim 9, wherein each of the first transistor, the second transistor, the third transistor, the fourth transistor, the fifth transistor, the sixth transistor, and the seventh transistor is one of a low temperature poly-silicon thin film transistor, an oxide semiconductor thin film transistor, or an amorphous silicon thin film transistor.

* * * * *